United States Patent [19]
Mizukami

[11] Patent Number: 5,644,544
[45] Date of Patent: Jul. 1, 1997

[54] SEMICONDUCTOR DYNAMIC RANDOM ACCESS MEMORY DEVICE VARIABLE IN REFRESH CYCLE

[75] Inventor: Takeshi Mizukami, Tokyo, Japan

[73] Assignee: NEC Corporation, Tokyo, Japan

[21] Appl. No.: 549,310

[22] Filed: Oct. 27, 1995

[30] Foreign Application Priority Data

Oct. 28, 1994 [JP] Japan .................................. 6-265569

[51] Int. Cl.$^6$ .................................................. G11C 13/00
[52] U.S. Cl. ...................................... 365/222; 365/189.01
[58] Field of Search ..................................... 365/222, 201, 365/189.01, 230.01

[56] References Cited

U.S. PATENT DOCUMENTS 3,737,879  6/1973  Greene et al. ........................... 365/222

FOREIGN PATENT DOCUMENTS 63-152094  6/1988  Japan .

*Primary Examiner*—Terrell W. Fears
*Attorney, Agent, or Firm*—Foley & Lardner

[57] ABSTRACT

A self-refreshing system incorporated in a semiconductor dynamic random access memory device is responsive to an external data signal indicative of a time interval of a refresh cycle so as to repeat a refreshing operation on memory cells at the time intervals, and the current consumption in the refresh mode is decreased through the optimization of the refresh cycle.

5 Claims, 9 Drawing Sheets

SEMICONDUCTOR DYNAMIC RANDOM ACCESS MEMORY DEVICE VARIABLE IN REFRESH CYCLE

FIELD OF THE INVENTION

This invention relates to a semiconductor dynamic random access memory device and, more particularly, to a semiconductor dynamic random access memory device equipped with a self-refreshing system for changing a refresh cycle.

DESCRIPTION OF THE RELATED ART

A typical example of the semiconductor dynamic random access memory device stores data bits in one-transistor one-capacitor memory cells, and the amount of electric charge in the storage capacitor is varied depending upon the logic level of the stored data bit. However, the accumulated electric charge is unavoidably leaked from the storage capacitor, and the memory cell loses the data bit through the leakage current. A refresh prevents the memory cells from the loss of data bit. The refresh is a rewriting sequence, and the semiconductor dynamic random access memory device repeats the refresh before the amount of electric charge is decreased below a critical level. All of the memory cells require the refresh, and the semiconductor dynamic random access memory device sequentially addresses the memory cells in the refresh mode. For this reason, an address signal and related control signals are required for the sequential refresh.

Although an external controlling device supplied the address signal and the control signals to the semiconductor dynamic random access memory device for the sequential refresh, most of the presently available semiconductor dynamic random access memory device is equipped with a built-in refreshing system, because the refresh control makes the control sequence complicated. Such an internal refresh control is called as "self-refresh".

FIG. 1 illustrates the arrangement of a prior art semiconductor dynamic random access memory device with a built-in self refreshing system, and the prior art semiconductor dynamic random access memory device illustrated in FIG. 1 is similar to the semiconductor dynamic random access memory device disclosed in Japanese Patent Publication of Unexamined Application No. 63-152094.

The prior art semiconductor dynamic random access memory device comprises a memory cell arrays 1, and the memory cells are of the one-transistor one-capacitor type. The memory cells are arranged in m rows and n columns. Word lines WL1 to WLm are respectively associated with the rows of memory cells, and are coupled to the gate electrodes of the switching transistors of the associated rows of memory cells. Bit line pairs BL1 to BLn are respectively associated with the columns of memory cells, and are coupled to the drain nodes of the switching transistors of the associated columns of memory cells.

A row address decoder 2 is coupled to the word lines WL1 to WLm, and selectively energizes the word lines WL1 to WLm so as to change the switching transistors of the selected word line to on-state.

Sense amplifiers 3 are respectively coupled to the bit line pairs BL1 to BLn, and magnifies potential differences on the bit line pairs BL1 to BLn.

The prior art semiconductor dynamic random access memory device further comprises a self-refreshing system 4 for periodically circulating the row address. The self-refreshing system 4 includes a self-refresh command discriminator 4a for producing a self-refresh initiation signal SR, a timer 4b for producing a periodical signal PR, a control clock generator 4c for producing a control clock signal CTL and a refresh address counter 4d for producing an internal row address signal ADD.

The self-refresh command discriminator 4a is coupled to control signal pins P1 and P2 assigned to a row address strobe signal RAS and a column address strobe signal CAS, respectively, and monitors the potential levels at the control signal pins P1 and P2. An external instruction signal indicative of the initiation of the self-refresh is supplied to the control signal pins P1 and P2, and decays the potential levels at the control signal pins P1 and p2 for a predetermined time period. Then, the self-refresh command discriminator 4a acknowledges the initiation of the self-refresh, and changes the self-refresh initiation signal SR to an active level. The self-refresh initiation signal SR is supplied to the timer 4b and the control clock generator 4c.

An oscillator 4e, a counter 4f and a divider 4g form in combination the timer 4b as shown in FIG. 2, and an array of inverters 4h, a switching circuit 4i and a NAND gate ND1 are incorporated in the divider 4g as shown in FIG. 3. The counter 4f is responsive to the output signal of the oscillator 4e so as to change a k-bit count signal Ci. The k-bit count signal Ci is supplied through the array of inverters 4h to the switching circuit 4i.

The switching circuit 4i is implemented by k switching elements, and each of the switching elements has a first input node IN1 and a second input node IN2 selectively coupled to an output node OUT. The output nodes OUT are coupled to the input nodes of the NAND gate ND1.

The k-bits of the count signal Ci are directly supplied to the first input nodes IN1, respectively, and the inverters 4h supply the complementary bits of the count signal Ci to the second input nodes IN2, respectively.

The input node IN1/IN2 connected to the output node OUT is fixed at a final stage of the fabrication process for the prior art semiconductor dynamic random access memory device. Aluminum wirings are provided for the switching elements, and either first or second input node N1/N2 is connected to the associated output node. The wiring work for the switching elements is called as "metal option".

The counter 4f sequentially changes the k bits, and the count signal Ci periodically reaches the maximum value of (11 ... 11). If all of the switching elements connect the first input nodes IN1 to the output node OUT, the k-bit count signal Ci is transferred to the input nodes of the NAND gate ND1, and the NAND gate periodically changes the periodical signal PR to the low level. On the other hand, while the counter 4f is incrementing the count signal toward the maximum value, at least one of the k bits is zero, and the NAND gate ND1 maintains the periodical signal PR to the high level.

However, if one of the switching elements connects the second input node IN2 to the output node OUT, the switching element transfers the complementary bit to the NAND gate ND1. Therefore, when the other bits are changed to the high level, the NAND gate ND1 changes the periodical signal PR to the low level. Thus, the lapse of time between the signal decays of the periodical signal PR is variable by changing the connections of the switching elements.

The control clock generator 4c is enabled with the self-refresh initiation signal SR, and periodically changes the control clock signal CTL in response to the periodical signal PR.

The refresh address counter 4d sequentially increments the row address represented by the internal row address signal ADD in response to the control clock signal CTL. The control clock signal CTL is further supplied to the sense amplifiers 3, and activates the sense amplifiers.

The row address decoder 2 decodes the internal row address signal ADD, and energizes the word line assigned the row address represented by the internal row address signal ADD. The selected word line electrically connects the row of memory cells to the bit line pairs BL1 to BLn, and small potential differences take place on the bit line pairs BL1 to BLn. The small potential differences are magnified by the sense amplifiers 3, and the high level or the low level is restored in each of the memory cells coupled to the selected word line.

When the control clock signal CTL is changed to the active level m times, the refresh address counter 4d completes a circulation of the row address, and the self refreshing system 4 refreshes all of the m rows of memory cells.

The lapse of time between the decays of the periodical signal PR is hereinbelow called as "refresh cycle" and the memory cell array 1 requires m refresh cycles to be completely refreshed.

The manufacturer determines the refresh cycle through the metal option as follows. As described hereinbefore, the accumulated electric charge leaks from the storage capacitor, and the amount of accumulated electric charge is decreased to a critical level which the sense amplifier can not discriminate. Even if the memory cells are formed from semiconductor wafers of the same lot, the memory cells are not equal in time interval between the restored level to the critical level to one another. The time interval is one of the characteristics of the memory cell called as hold characteristics, and the time interval is called as hold time.

The hold characteristics have temperature dependency. If the temperature is increased by 10 degrees centigrade, the hold time is decreased to a half. For this reason, the hold time is drastically decreased at high temperature, and the refresh cycle is determined on the basis of the hold time at high temperature. On the other hand, the current consumption of the self-refresh system 4 is inversely proportional to the refresh cycle. The oscillator 4e is less dependent on the temperature.

If the hold time is shorter than the refresh cycle, the semiconductor dynamic random access memory device can not serve as a reliable data storage, and is rejected as a defective product. The manufacturer can not change the refresh cycle after the assemblage of the semiconductor dynamic random access memory device. For this reason, the manufacturer tends to set the refresh cycle to be sufficiently longer than the hold time, and a problem inherent in the prior art semiconductor dynamic random access memory device is large amount of current consumption.

SUMMARY OF THE INVENTION

It is therefore an important object of the present invention to provide a dynamic random access memory device the refresh cycle of which is regulable after a packaging stage.

To accomplish the object, the present invention proposes to instruct a self-refreshing system of appropriate time interval of a refresh cycle.

In accordance with the present invention, there is provided a semiconductor memory device fabricated on a semiconductor chip, comprising: a memory cell array; an access means selecting at least one memory cell from the memory cell array in a memory access mode so as to carry out a read-out of a data and a write-in of a data to the selected memory cell; a terminal means receiving information for determining a refresh cycle from the outside of the semiconductor chip in the refresh mode; and a refresh means including a refresh timer for periodically generating a timer signal, and carrying out a refreshing operation on the memory cell array on the basis of the timer signal supplied from the refresh timer in a refresh mode, the refresh means further including a means responsive to the information so as to cause the refresh timer to change an interval of the timer signal.

The access signal may one of or both of an address signal and a data signal.

BRIEF DESCRIPTION OF THE DRAWINGS

The features and advantages of the semiconductor dynamic random access memory device according to the present invention will be more clearly understood from the following description taken in conjunction with the accompanying drawings in which.

DESCRIPTION OF THE PREFERRED EMBODIMENTS

First Embodiment

Figure 1:
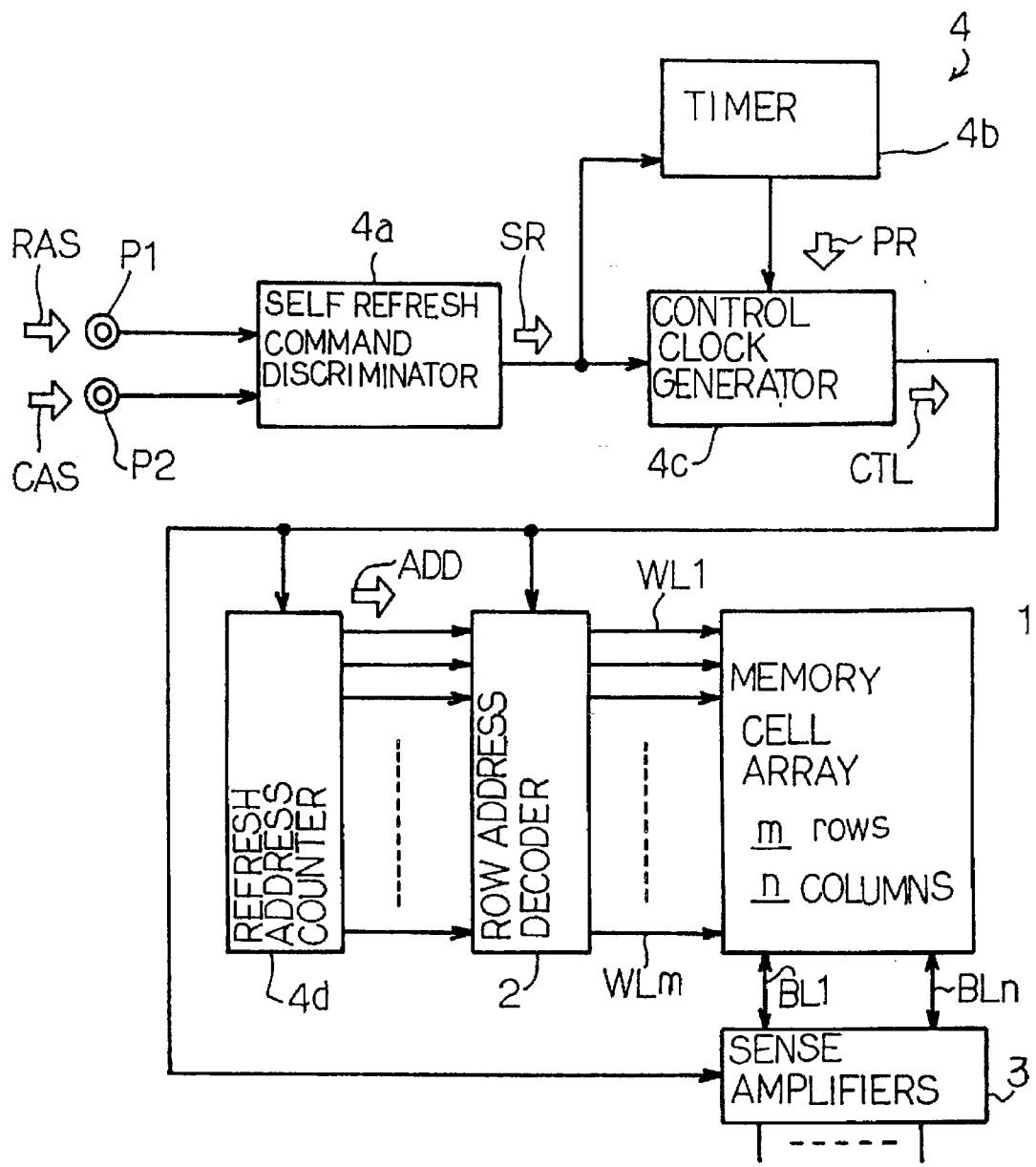
FIG. 1 is a block diagram showing the arrangement of the prior art semiconductor dynamic random access memory device.
Figure 2:
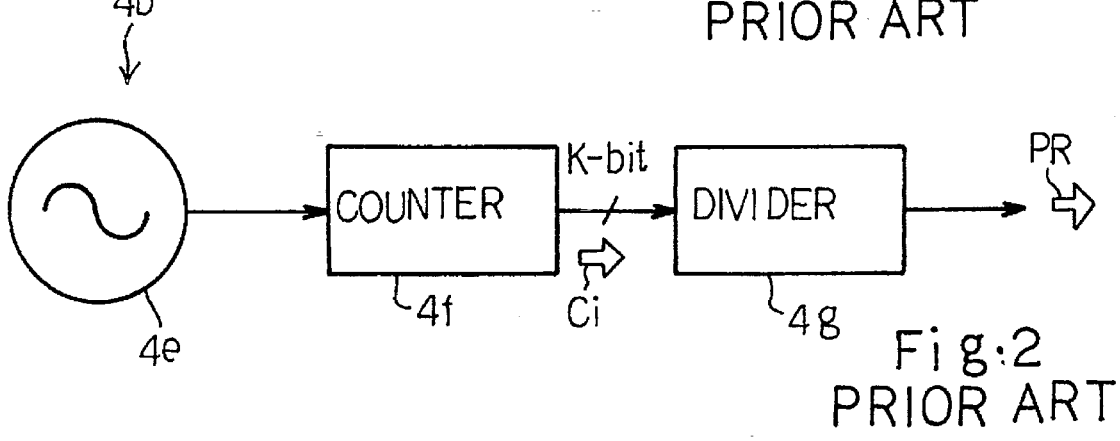
FIG. 2 is a block diagram showing the circuit arrangement of the timer incorporated in the prior art semiconductor dynamic random access memory device.
Figure 3:
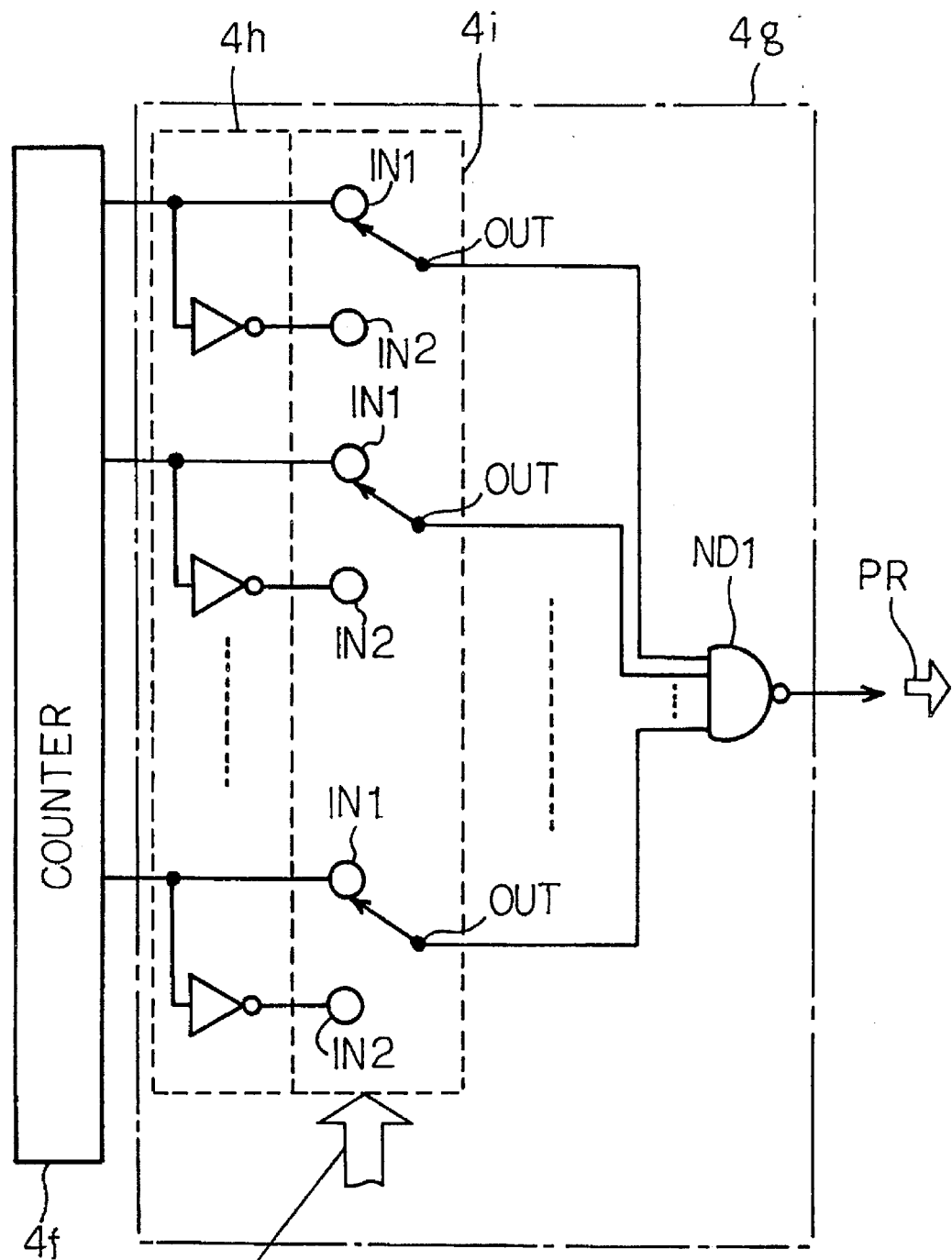
FIG. 3 is a circuit diagram showing the arrangement of the divider incorporated in the prior art semiconductor dynamic random access memory device.
Figure 4:
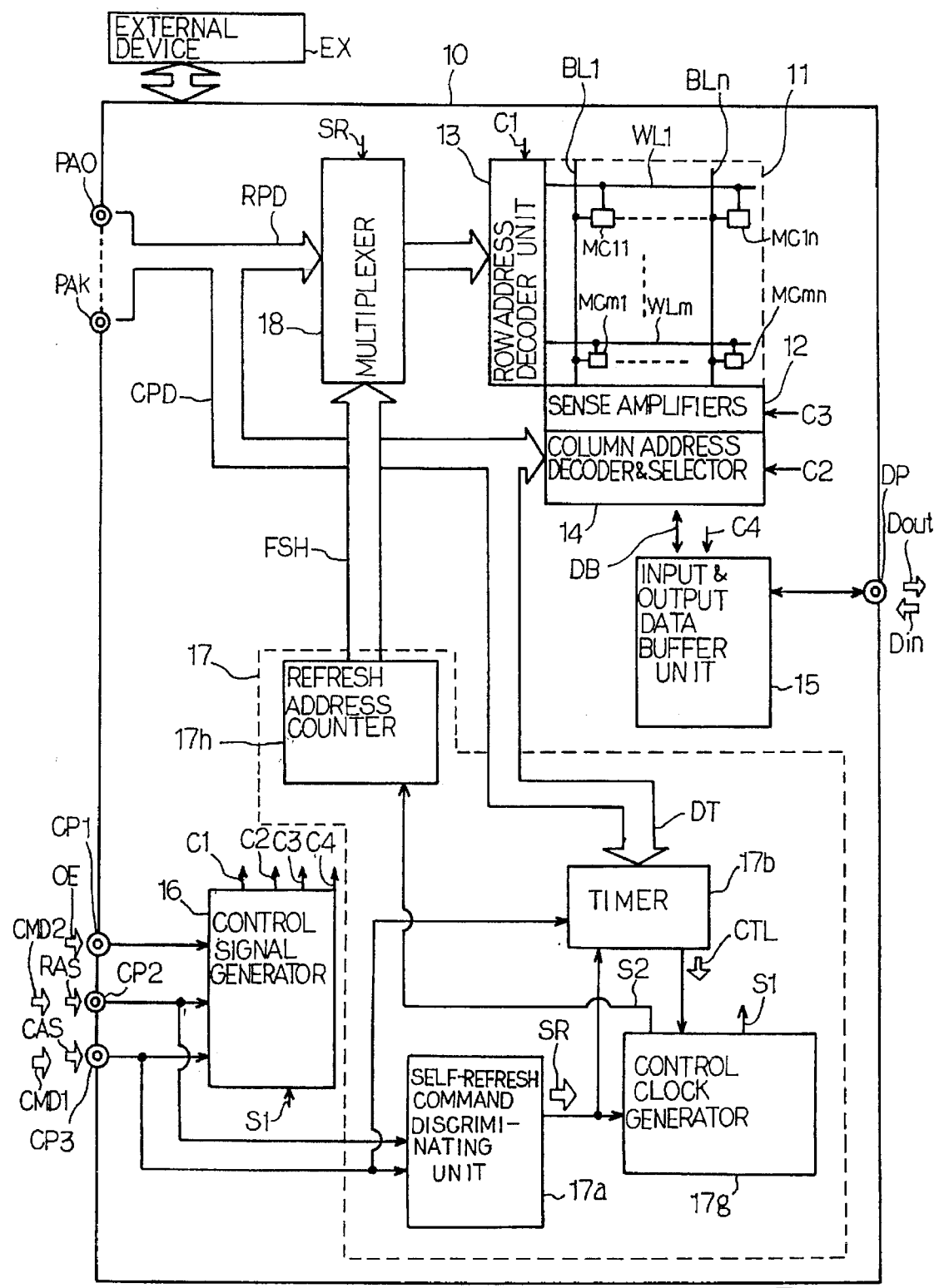
FIG. 4 is a block diagram showing the arrangement of a semiconductor dynamic random access memory device according to the present invention.

Referring first to FIG. 4 of the drawings, a semiconductor dynamic random access memory device is fabricated on a single semiconductor chip 10, and has a memory access mode and a refresh mode. When an external device reads a data bit from and writes a data bit into the semiconductor dynamic random access memory device, the memory access mode is established in the semiconductor dynamic random access memory device. On the other hand, if a data is not accessed over critical time period, the refresh mode is established in the semiconductor dynamic random access memory device.

The semiconductor dynamic random access memory device comprises a memory cell array 11. A plurality of memory cells MC11 to MC1n, . . . and MCm1–MCmn form in combination the memory cell array 11, and are arranged in rows and columns. The memory cells are of the one-transistor one capacitor type, and, accordingly, a series of switching transistor and a storage capacitor serves as each of the memory cells MC11 to MCmn. The memory cells MC11 to MCmn store data bits in the form of electric charge, and the electric charge is accumulated in the storage capacitor of the memory cell.

The semiconductor dynamic random access memory device further comprises a plurality of word lines WL1 to WLm associated with the rows of memory cells, respectively. The word lines WL1 to WLm are respectively coupled to the gate electrodes of the switching transistors of the associated rows of memory cells.

The semiconductor dynamic random access memory device further comprises a plurality of bit line pairs BL1 to BLn respectively associated with the columns of memory cells. Each of the bit line pairs BL1 to BLn has two bit lines, and one of the bit lines is coupled to the drain nodes of the switching transistors of the associated column of memory cells. The bit line pairs BL1 to BLn are charged to a precharge level between high level and low level, and bit lines coupled to the switching transistors are selectively changed to the high level or the low level depending upon the data bits stored in the associated memory cells. Then, potential differences take place on the bit line pairs BL1 to BLn.

The semiconductor dynamic random access memory device further comprises sense amplifiers 12 respectively coupled to the bit line pairs BL1 to BLn, and the sense amplifiers 12 magnifies the potential differences on the bit line pairs BL1 to BLn.

The semiconductor dynamic random access memory device further comprises a plurality of address pins PA0 to PAk, a row address decoder unit 13 coupled to the word lines WL1 to WLm and a column address decoder and selector unit 14 coupled between the bit line pairs BL1 to BLn and a data bus DB.

An external address signal is supplied to the address pins PA0 to PAk, and row address predecoded signals RPD and column address predecoded signals CPD are produced from row address bits of the external address signal and column address bits of the external address signal, respectively.

The row address decoder unit 13 is responsive to the row address predecoded signals RPD or refresh address signals FSH so as to selectively energize the word lines WL1 to WLm. The switching transistors coupled to the selected word line turn on, and the storage capacitors are electrically connected to the bit lines of the associated pairs BL1 to BLn.

The column address decoder and selector unit 14 is responsive to the column address predecoded signals CPD, and selectively connects the bit line pairs BL1 to BLn to the data bus DB. When a data bit is written into one of the memory cells MC11 to MCmn, a potential difference indicative of the write-in data bit is transferred from the data bus DB through the column address decoder and selector unit 14 to one of the bit line pairs BL1 to BLn. On the other hand, one of the potential differences indicative of a read-out data bit is transferred from the bit line pair through the column address decoder and selector unit 14 to the data bus DB. However, the column address decoder and selector unit 14 does not couple the bit line pairs BL1 to BLn to the data bus DB in the refresh mode.

The semiconductor dynamic random access memory device further comprises an input and output data buffer unit 15 coupled between the data bus DB and a data pin DP. The input and output data buffer unit 15 produces an output data signal Dout from the potential difference indicative of the read-out data bit and the potential difference indicative of the write-in data bit from an input data signal Din.

The semiconductor dynamic random access memory device further comprises control signal pins CP1, CP2 and CP3 respectively assigned to an output enable signal OE, a row address strobe signal RAS and a column address strobe signal CAS in the memory access mode and a control signal generator 16 coupled to the control signal pins CP1 to CP3 for generating internal control signals C1, C2, C3 and C4. The internal control signals C1 to C4 are respectively supplied to the row address decoder unit 13, the column address decoder and selector unit 14, the sense amplifiers 12 and the input and output data buffer unit 15.

While the semiconductor dynamic random access memory device is operating in the memory access mode, the row address strobe signal RAS is firstly changed to the active low level, and the control signal generator unit 16 changes the internal control signal C1 to the active high level. With the internal control signal C1, the row address bits of the external address signal are latched by an address buffer unit (not shown), and the row address predecoded signals RPD are supplied to the row address decoder unit 13. The row address decoder unit 13 boosts one of the word lines WL1 to WLm assigned to the row address indicated by the row address bits, and the storage capacitors of the associated row of memory cells are electrically connected to the bit lines of the associated pairs BL1 to BLn.

Subsequently, the column address strobe signal CAS is changed to the active low level, and the control signal generator 16 changes the internal control signal C2 to the active high level, and the address buffer unit (not shown) latches the column address bits of the external address signal. The column address predecoded signals CPD are supplied to the column address decoder and selector unit 14, and the column address decoder and selector unit 14 couples one of the bit line pairs BL1 to BLn assigned the column address indicated by the column address bits to the data bus DB.

The control signal generator unit 16 subsequently changes the internal control signal C3 to the active high level, and the sense amplifiers 12 start the magnification on the potential differences on the associated bit line pairs BL1 to BLn.

The output enable signal OE of the active low level is indicative of the data read-out, and causes the control signal generator 16 to change the internal control signal C4 to the active high level. The potential difference on the selected bit line has been transferred through the data bus DB to the input and output data buffer unit 15, and the input and output data buffer unit 15 produces the output data signal Dout from the potential difference on the data bus DB. The output data signal Dout is supplied to the data pin DP.

On the other hand, if the output enable signal is in the inactive high level, the control signal generator 16 maintains the internal control signal in the low level, and the input and output data buffer unit 15 produces the potential difference from the input data signal Din. The potential difference is transferred through the data bus DB and the column address decoder and selector unit 14 to the selected bit line pair.

The semiconductor dynamic random access memory device further comprises a self-refresh system 17 for generating the self refresh address FSH and a multiplexer 18 provided for the row address decoder unit 13. The multiplexer 18 is responsive to a self-refresh signal SR so as to selectively transfer the row address predecoded signals RPD and the refresh address signals FSH to the row address decoder unit 13 depending upon the mode of operation.

In detail, while the semiconductor dynamic random access memory device is in the memory access mode, the self-refresh signal SR is staying in the inactive low level, and the multiplexer 18 transfers the row address predecoded signals RPD to the row address decoder unit 13. On the other hand, the self-refresh signal SR is changed to the active high level in the refresh mode, and the multiplexer 18 transfers the refresh address signals FSH to the row address decoder unit 13.

The self-refreshing system 17 includes a self-refresh command discriminating unit 17a coupled to the control signal pins CP2 and CP3, and a refresh command signal CMD1/CMD2 is supplied to the control signal pins CP3 and CP2 in the refresh mode. Although the row address strobe signal RAS and the column address strobe signal CAS are also supplied to the control signal pins CP2 and CP3, the control signal pin CP2 is firstly decayed and the control signal pin CP3 follows in the memory access mode. However, the self-refresh command signal CMD1/CMD2 firstly changes the control signal pin CP3 to the low level, and, thereafter, changes the control signal pin CP2 to the low level. The self-refresh command signal CMD1/CMD2 maintains both control signal pins CP2 and CP3 in the low level for predetermined time period tRASS, and the predetermined time period tRASS is about 100 micro-second. The semiconductor dynamic random access memory device enters into the refresh mode. Thus, the self-refresh command signal CMD1/CMD2 is discriminative from the row address strobe signal RAS and the column address strobe signal CAS, and the self-refresh command discriminating unit 17a changes the self-refresh signal SR to the active high level upon discrimination of the self-refresh command signal CMD1/CMD2.

Figure 5:
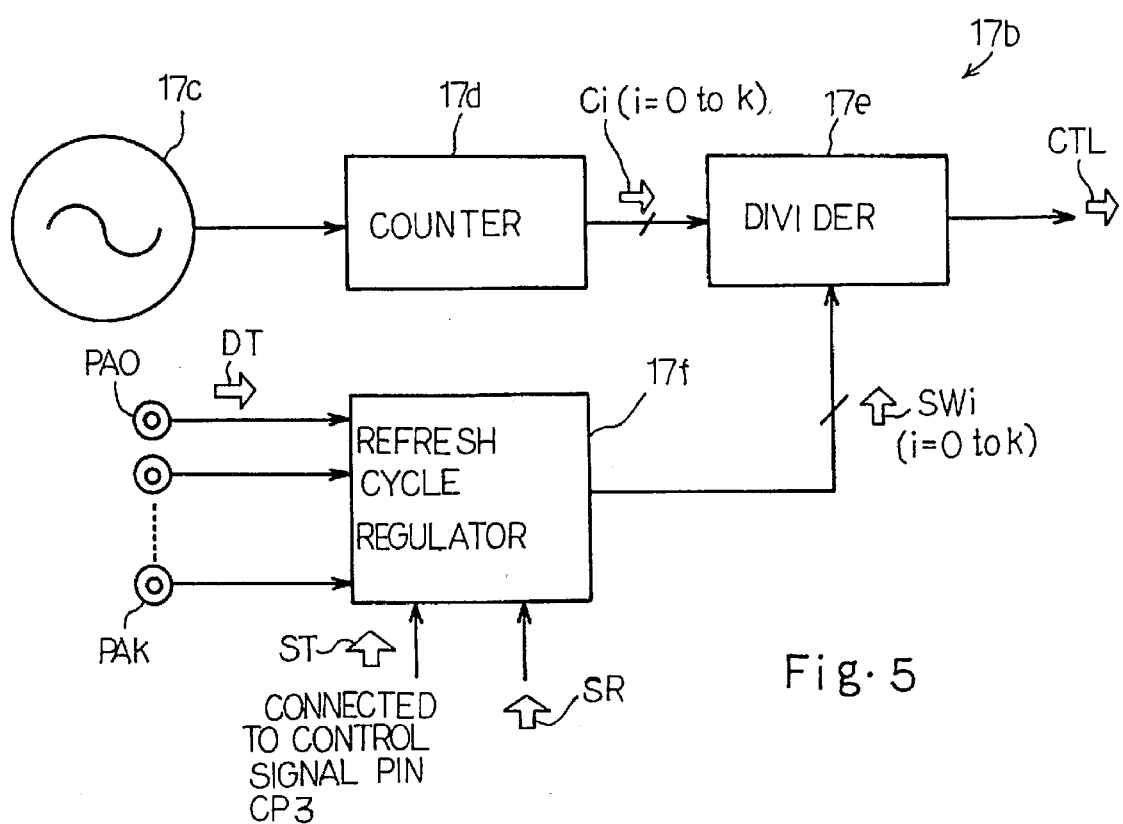
FIG. 5 is a block diagram showing the circuit arrangement of a timer incorporated in the semiconductor dynamic random access memory device.

The self-refreshing system 17 further comprises a timer 17b enabled with the self-refresh signal SR, and FIG. 5 illustrates the circuit arrangement of the timer 17. An oscillator 17c, a counter 17d, a divider 17e and a refresh cycle regulator 17f form in combination the timer 17b as shown in FIG. 5. The oscillator 17c supplies a periodic signal to the counter 17d, and the counter 17d increments the value of the count signal Ci in response to the periodic signal. The count signal Ci is supplied to the divider 17e, and the divider periodically changes a timing control signal CTL to the active low level. The timing control signal CTL defines the refresh cycle, and the refresh cycle regulator 17f supplies time interval for the refresh cycle through a control signal SWi to the divider 17e. The refresh cycle regulator 17f is enabled with the self-refresh signal SR, and latches a control data signal DT indicative of the time period supplied to the address pins PA0 to PAk in synchronism with a strobe signal ST supplied to the control signal pin CP3.

Figure 6:
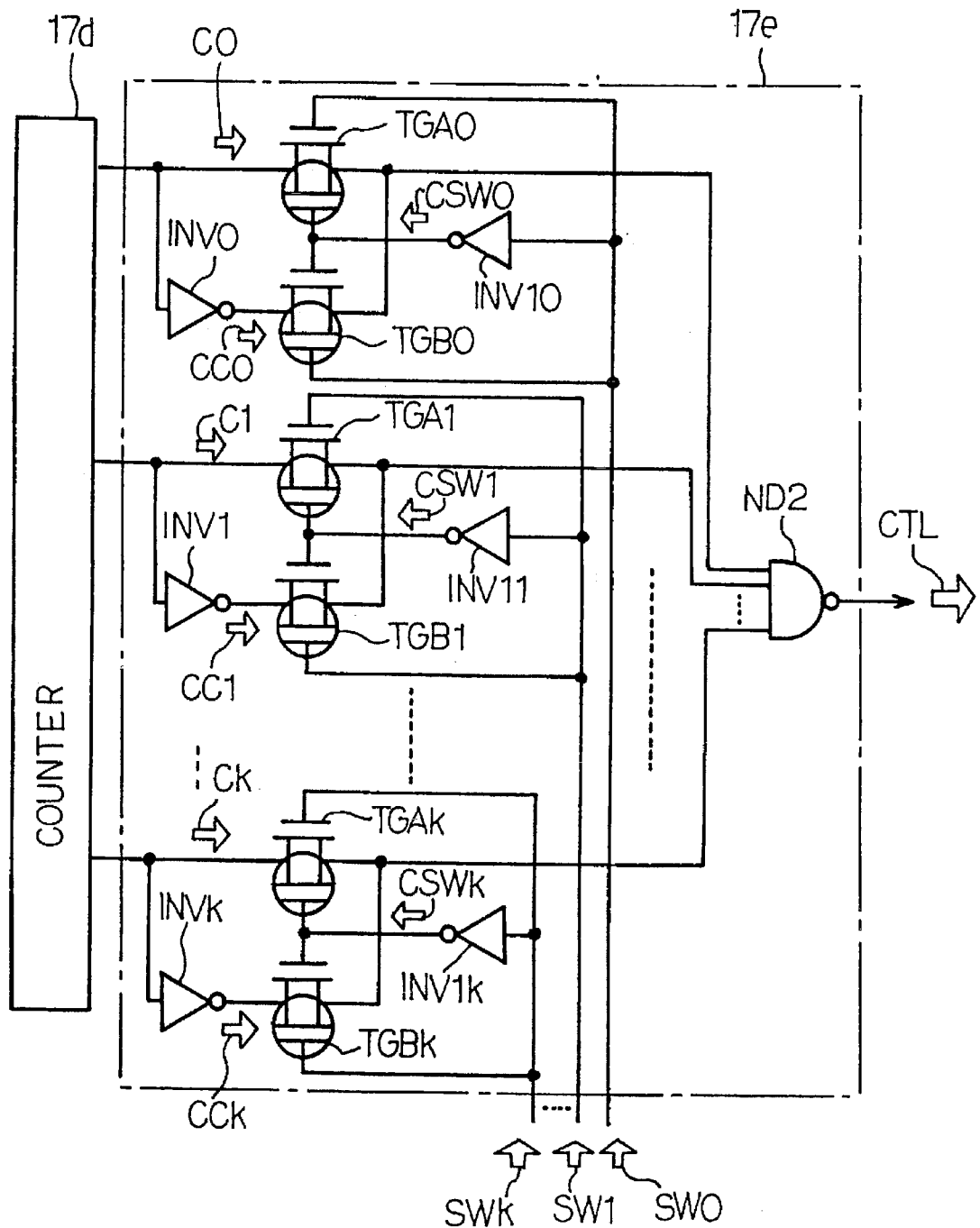
FIG. 6 is a circuit diagram showing the circuit arrangement of a divider incorporated in the timer.

FIG. 6 illustrates the circuit arrangement of the divider 17e, and includes inverters INV0, INV1, . . . INVk for producing complementary bits CC0 to CCk of the count signal Ci, pairs of transfer gates TGA0/TGB0, TGA1/TGB1, . . . and TGAk/TGBk, a NAND gate ND2 coupled to the pairs of transfer gates TGA0/TGB0 to TGAk/TGBk for producing the timing control signal CTL and inverters INV10, INV11, . . . and INV1k for producing complementary bits CSW0, CSW1, . . . and CSWk of the control signal SWi. The bits SW0 to SWk and the complementary bits CSW0 to CSWk are supplied to the pairs of transfer gates TGA0/TGB0 to TGAk/TGBk, and complementarily change the transfer gates TGA0 to TGAk and the transfer gates TGB0 to TGBk between on-state and off-state. Each pair of transfer gates TGA0/TGB0, TGA1/TGB1 or TGAk/TGBk transfers the associated bit C0/C1/Ck or the complementary bit CC0/CC1/CCk to the NAND gate ND2, and the NAND gate ND2 changes the timing control signal CTL to the active low level when all of the bits/complementary bits at the input nodes thereof are the high level or logic "1". The counter circulates the value expressed by the count signal Ci, and all of the bits C0 to Ck become logic "1" level once a circulation. However, if a pair of transfer gates such as TGAk/TGBk selects the complementary bit CCk, all of the input nodes of the NAND gate ND2 become logic "1" level in so far as the other bits CC0, CC1, . . . are logic "1" level. Thus, the divider 17e changes the time interval of the timing control signal CTL at the active low level in response to the control signal SWi.

Let's assume that k is "2". If the control signal SW0/SW1/SW2 is (1 1 1), the pairs of transfer gates TGA0/TGB0 to TGA2/TGB2 transfers the count signal C0/C1/C2, and the timing control signal CTL is changed to the active low level at 3t where t is the period of the periodic signal of the oscillator 17c. This results in that the refresh cycle tSR is adjusted to 3t.

However, if the control signal SW0/SW1/SW2 is (1 0 1), the pairs of transfer gates TGA0/TGB0 and TGA2/TGB2 transfer the complementary bits CC0 and CC2, and the pair of transfer gate TGA1/TGB1 transfers the count bit C1. The NAND gate ND2 changes the timing control signal CTL to the active low level at every 2t, and the refresh cycle tSR is adjusted to 2t.

Figure 7:
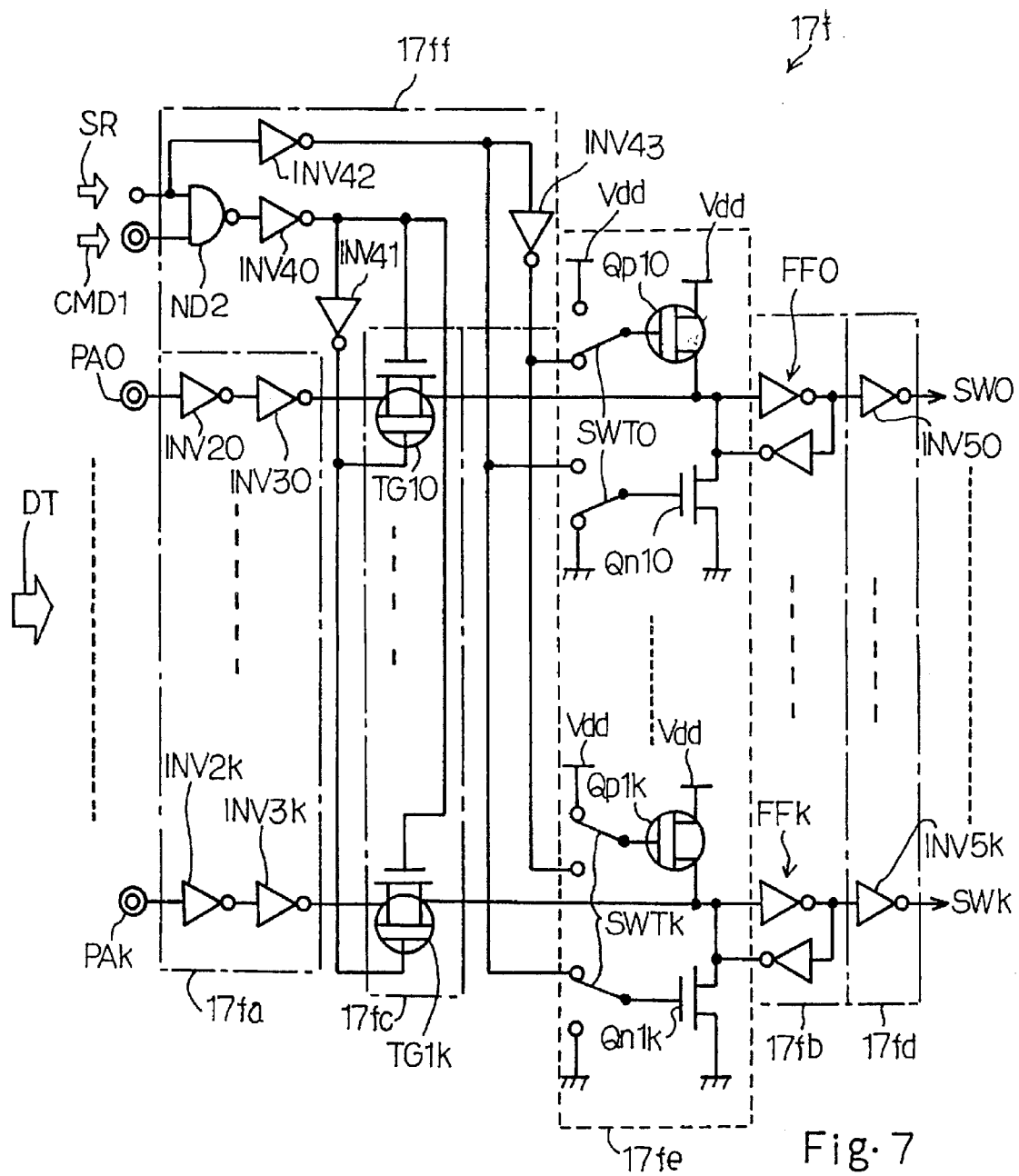
FIG. 7 is a circuit diagram showing the circuit arrangement of a refresh cycle regulator incorporated in the timer.

FIG. 7 illustrates the circuit arrangement of the refresh cycle regulator 17f, and the refresh cycle regulator 17f largely comprises a data input section 17fa coupled to the address pins PA0 to PAk, a data storage section 17fb for storing control data information indicative of the time interval of the refresh cycle, a transfer section 17fc coupled between the data input section 17fa and the data storage section 17fb, an output section 17fd for producing the control signal SWi, a default section 17fe for providing a default value of the time interval and a control section 17ff for controlling the transfer section 17fc and the default section 17fe.

An external device EX supplies the control data signal DT indicative of the time interval of the refresh cycle to the address pins PA0 to PAk, and the control data signal DATA is transferred to the data input section 17fa.

Inverters INV21 to INV2k and INV30 to INV3k form in combination the data input section 17fa, and transfer the control gate signal DATA to the transfer section 17fc.

The transfer section is implemented by transfer gates TG10 to TG1k, and concurrently turn on and off under the control of the control section 17f.

The control section 17f includes a NAND gate ND2 and inverters INV40, INV41, INV42 and INV43. The self-refresh signal SR and the self-refresh command bit CMD1 are supplied to the NAND gate ND2. After the entry into the refresh mode, the self-refresh command bit CMD1 is changed to the high level for a moment (see FIG. 8), and the control data signal DT is supplied to the address pins PA0 to PAk in synchronism with the self-refresh command bit CMD1 changed to the high level. As described hereinbefore, the self-refresh command discriminating unit 17a changes the self-refresh signal SR to the high level upon discriminating the self-refresh command signal CMD1/CMD2, and the self-refresh command bit CMD1 temporally changed to the high level causes the NAND gate ND2 to change the output signal thereof to the low level or logic "0" level. The inverter INV40 supplies the high level signal to the n-channel enhancement type switching transistors of the transfer gates TG10 to TG1k, and the inverter INV41 supplies the low level signal to the p-channel enhancement type switching transistors of the transfer gates TG10 to TG1k. For this reason, the transfer gates TG10 to TG1k turn on, and transfer the control data signal DT to the data storage section 17fb.

The data storage section 17fb is implemented by flip flop circuits FF0 to FFk or loops of inverters, and the control data signal DT is stored in the data storage section 17fb as the control data information.

The data storage section 17fb supplies the control data information to the data output section 17fd implemented by inverters INV50 to INV5k, and the inverters INV50 to INV5k produces the control data signal SWi.

Thus, the refresh cycle regulator 17f temporally stores the control data information indicative of the time interval of the refresh cycle, and supplies the control data signal SWi to the pairs of transfer gates TGA0/TGB0 to TGAk/TGBk.

The default section 17fe includes p-channel enhancement type switching transistors Qp10 to Qp1k coupled between the source of power voltage Vdd and input nodes of the flip flops FF0 to FFk, n-channel enhancement type switching transistors Qn10 to Qn1k coupled between the source of ground voltage and the input nodes of the flip flops FF0 to FFk and switches SWT0 to SWTk associated with the p-channel/n-channel switching transistors Qp10–Qp1k/Qn10–Qn1k. The switches SWT0 to SWTk fix the gate electrodes of the p-channel enhancement type switching transistors Qp10 to Qp1k to one of the source of power voltage level Vdd and the output node of the inverter INV43 and the gate electrodes of the n-channel enhancement type switching transistors Qn10 to Qn1k to one of the source of ground voltage and the output node of inverter INV42 through the metal option.

Before the discrimination of the self-refresh command signal CMD1/CMD2, the self-refresh signal SR remains in the low level, and the inverter INV42 and the inverter INV43 supplies the high level and the low level to the switches SWT0 to SWTk. The p-channel enhancement type switching transistor Qp10 is turned on, and the n-channel enhancement type switching transistor Qn10 is turned off. On the other hand, the p-channel enhancement type switching transistor Qp1k is turned off, and the n-channel enhancement type switching transistor Qn1k is turned on. Thus, the switches SWT0 to SWTk supply the default value (1 . . . 0) to the data storage section 17fb.

However, when the self-refresh signal SR is changed to the high level, the inverter INV42 changes the output node thereof to the low level, and the inverter INV43 changes the output node to the high level. As a result, all of the p-channel/n-channel switching transistors Qp10–Qp1k and Qn10–Qn1k turn off, and the default value is canceled with the control data signal DT.

The self-refreshing system 17 further includes a control clock generator 17g and a refresh address counter 7h. The control clock generator 17g is enabled with the self-refresh signal SR, and periodically generates control clock signals S1 and S2. The control clock signal S1 is supplied to the control signal generator 16 in synchronism with the timing control signal CTL, and causes the control signal generator 16 to change the internal control signals C1 and C3 to the active high level.

The internal control signal C1 enables the row address decoder unit 13, and allows the row address decoder unit 13 to decode the refresh row address signals FSH. On the other hand, the internal control signal C3 activates the sense amplifiers 12, and the sense amplifiers 12 magnify the potential differences on the bit line pairs BL1 to BLn. The potential differences magnified by the sense amplifiers 12 are restored in the row of memory cells coupled to the word line selected with the refresh row address signals CPD.

The control clock signal S2 is supplied to the refresh address counter 17h, and causes the refresh address counter 17h to increment the row address represented by the refresh address signals FSH.

Thus, the control clock generator 17g is responsive to the timing control signal CTL so as to increment the row address with the control clock signal S2 and enable the row address decoder unit 13 and the sense amplifiers 12 with the control clock signal S1.

The circuit behavior in the memory access mode is similar to that of the prior art semiconductor dynamic random access memory device, and description is not made on the memory access mode.

Figure 8:
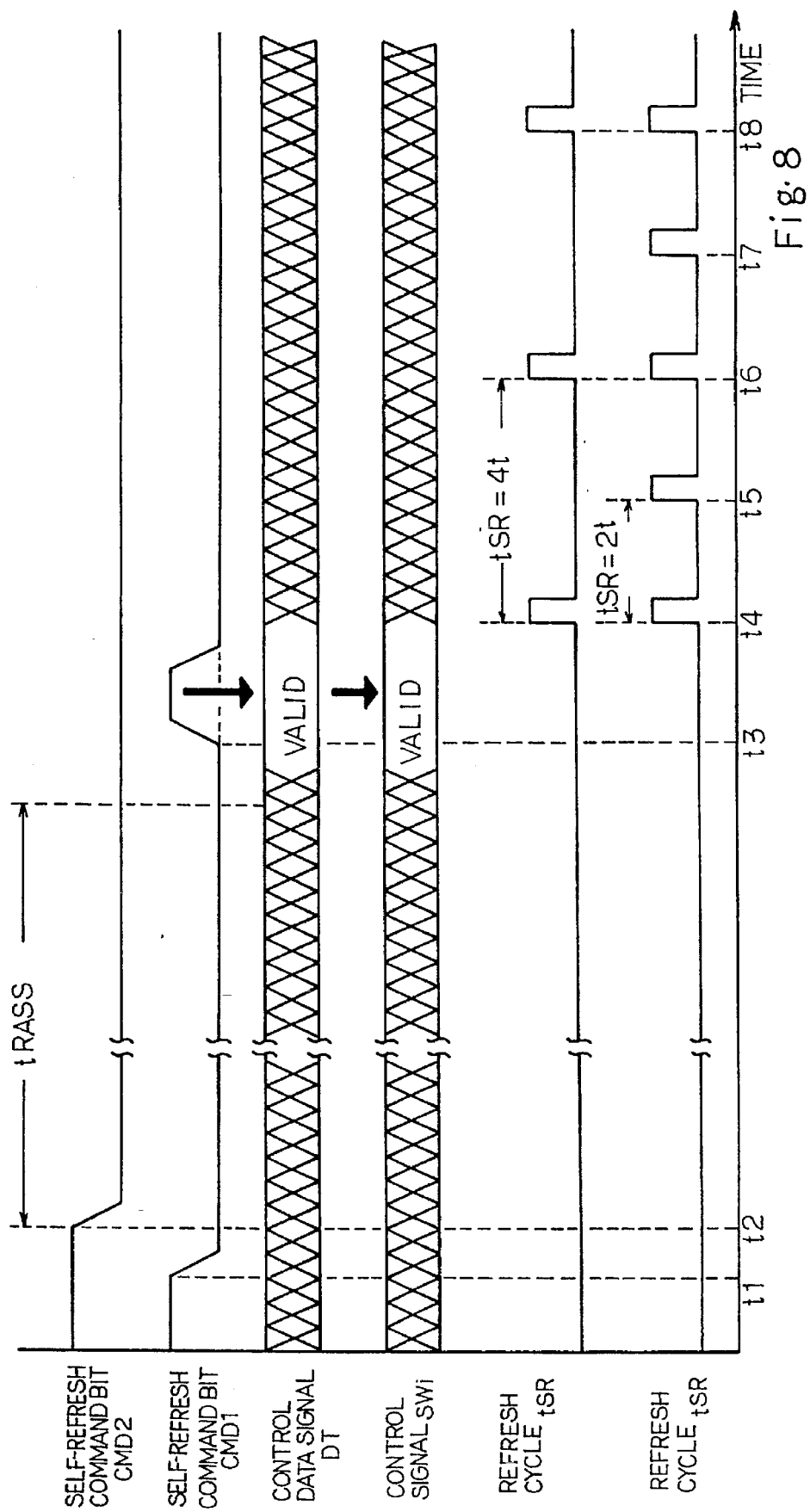
FIG. 8 is a timing chart showing a refresh mode of the semiconductor dynamic random access memory device.

The refresh mode is described hereinbelow with reference to FIG. 8. The external device EX changes the self-refresh command bit CMD1 to the active low level at time t1 and the self-refresh command bit CMD2 to the active low level at time t2. The self-refresh command discriminating unit 17a acknowledges the self-refresh command, and changes the self-refresh signal SR to the active high level. The self-refresh signal SR enables the refresh cycle regulator 17f and the control clock generator 17g.

After the lapse of time tRASS from time t2, the external device EX changes the self-refresh command bit CMD1 to the high level at time t3, and supplies the control data signal DT indicative of the time interval of the refresh cycle to the address pins PA0 to PAk. The refresh cycle regulator 17f produces the control signal SWi from the control data signal DT, and the divider 17e changes the time interval of the refresh cycle in response to the control signal SWi.

Of course, if the external device EX does not supply the control data signal DT, the refresh-cycle regulator supplies the control data signal SWi indicative of the default value, and the divider 17e changes the timing control signal CTL to the active low level at every standard time interval.

The counter 17d increments the value in response to the periodic signal supplied from the oscillator 17c, and, accordingly, changes the bit pattern of the count signal Ci.

If all of the input nodes of the NAND gate ND2 are changed to logic "1" level at time t4, the NAND gate ND2 changes the timing control signal CTL to the active low level, and the control clock generator 17g changes the control clock signal S1. The control signal generator 16 enables the row address decoder unit 13 with the internal control signal C1, and the multiplexer 18 connects the refresh address counter 17h to the row address decoder unit 13 in response to the self-refresh signal SR. The refresh row address signals FSH are supplied from the refresh address counter 17h through the multiplexer 18 to the row address decoder unit 13, and the row address decoder unit 13 boosts the word line assigned the row address represented by the refresh row address signals FSH.

The switching transistors coupled to the selected word line turn on, and couple the storage capacitors to the bit lines already equalized with the associated bit lines. Then, small potential differences take place on the bit line pairs BL1 to BLn, and are propagated to the sense amplifiers 12.

The control signal generator 16 changes the internal control signal C3 to the active high level, and the sense amplifiers 12 starts the magnification of the potential differences on the bit line pairs BL1 to BLn. The potential differences thus magnified are propagated to the memory cells associated with the selected word line, and are restored in the memory cells.

The word line decays the potential level on the selected word line, and the refresh on the selected row is completed.

The control clock generator 17g changes the control clock signal S2, and the refresh address counter 17h increments the row address stored therein.

Thus, if the refresh cycle is regulated to 4t, the divider 17e periodically changes the timing control signal CTL at times t6, t8, . . . , and the row address decoder unit 13 and the sense amplifiers 12 repeat the refresh on the rows of memory cells MC11–MC1n, . . . and MCm1–MCmn.

On the other hand, if the refresh cycle is regulated to 2t, the divider periodically changes the timing control signal CTL at times t5, t6, t7, t8, . . . , and the row address decoder unit 13 an ht sense amplifiers 12 repeat the refresh on the rows of memory cells at short intervals.

In this instance, the row address decoder unit 13, the word lines WL1 to WLm and the column address decoder and selector unit 14 as a whole constitute an access means. The address pins PA0 to PAk serve as a terminal means, and the self-refreshing system 17 is corresponding to the refresh means.

As will be appreciated from the foregoing description, the self-refreshing system 17 is responsive to the control data signal DT so as to regulate the time interval of the refresh cycle, and the refresh cycle is easily optimized even after the installation into an electronic system. This results in the decrease of the current consumption through the optimization of the refresh cycle.

Second Embodiment

Figure 9:
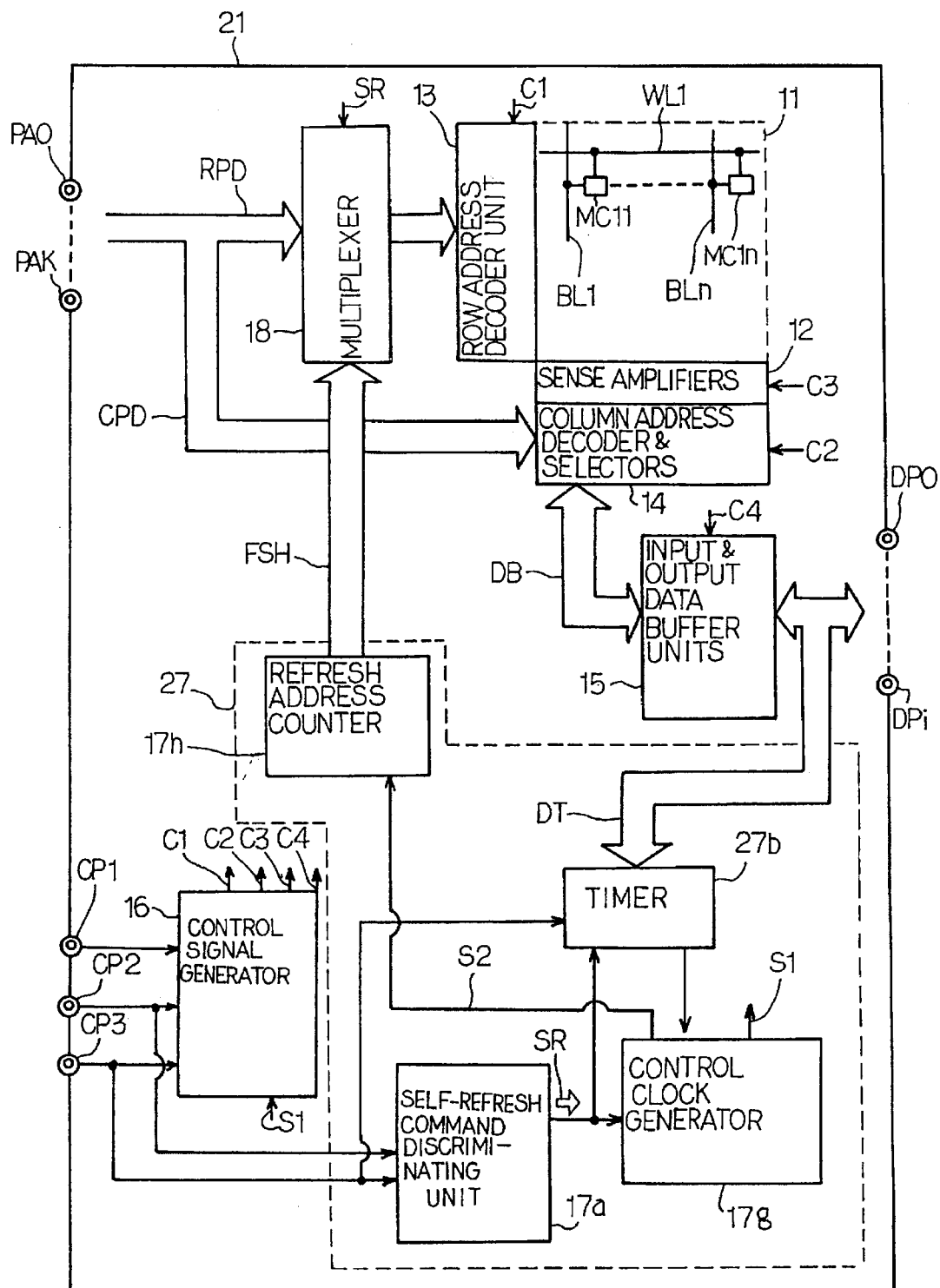
FIG. 9 is a block diagram showing the arrangement of another semiconductor dynamic random access memory device according to the present invention.

Turning to FIG. 9 of the drawings, another semiconductor dynamic random access memory device is fabricated on a semiconductor chip 21. A difference from the first embodiment is an input/output data port DP0 to DPi, and a multi-bit input data signal and a multi-bit output data signal are supplied through the input/output data port DP0 to DPi. For this reason, the column selector, the data bus DB and input and the output data buffer unit 15 are multiplied for the second embodiment. However, units and circuits of the second embodiment are labeled with the same references as those of the first embodiment without detailed description.

Another difference from the first embodiment is a refresh cycle regulator incorporated in a timer 27b. The other components of the self-refreshing system 27 are similar to those of the first embodiment, and the timer 27b is further similar to those of the timer 17b except for the refresh cycle regulator. For this reason, the components of the self-refreshing system 27 are designated by the same references as those of the self-refreshing system 17.

The control data signal DT is supplied from the input/output data port DP0 to DPi to the input section of the refresh cycle regulator of the timer 27b, and the other features are similar to the refresh-cycle regulator 17f.

The semiconductor dynamic random access memory device implementing the second embodiment achieves all of the advantages of the first embodiment.

Third Embodiment

Figure 10:
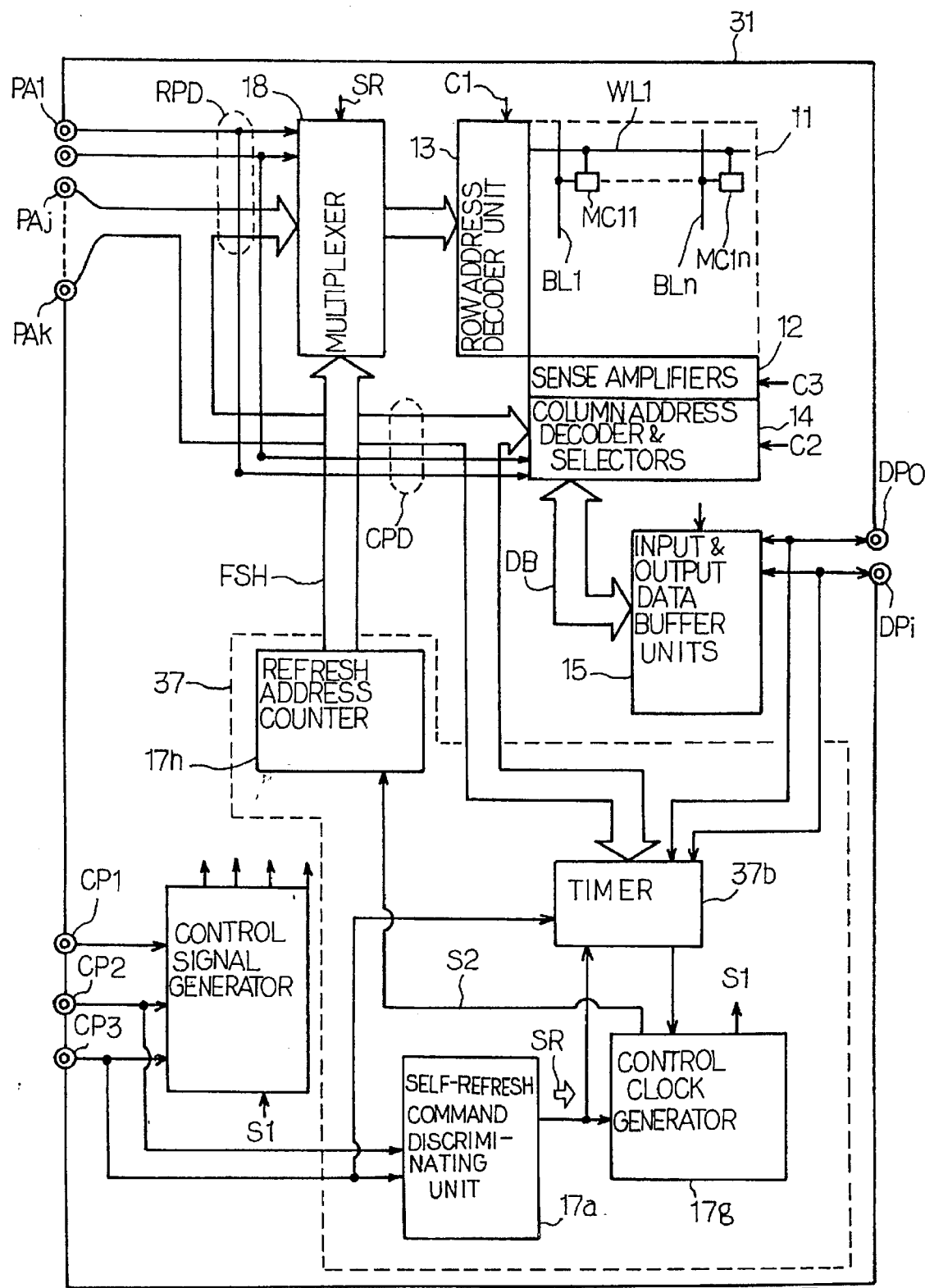
FIG. 10 is a block diagram showing the arrangement of yet another semiconductor dynamic random access memory device according to the present invention.

Turning to FIG. 10 of the drawings, another semiconductor dynamic random access memory device is fabricated on a semiconductor chip 31. A multi-bit input data signal and a multi-bit output data signal are supplied through an input/output data port DP0 to DPi as similar to the second embodiment, and the column selector, the data bus DB and input and the output data buffer unit 15 are also multiplied for the third embodiment. Units and circuits of the third embodiment are labeled with the same references as those of the first embodiment without detailed description.

A refresh cycle regulator incorporated in a timer 37b is different from those of the first and second embodiments. The other components of the self-refreshing system 37 are similar to those of the first embodiment, and the timer 37b is further similar to those of the timer 17b except for the refresh cycle regulator. For this reason, the components of the self-refreshing system 37 are designated by the same references as those of the self-refreshing system 17.

The control data signal DT is supplied partially from the address pins PAj to PAk and partially from the input/output data port DP0 to DPi to the input section of the refresh cycle regulator of the timer 37b, and the other features are similar to the refresh-cycle regulator 17f.

The semiconductor dynamic random access memory device implementing the third embodiment achieves all of the advantages of the first embodiment.

Although particular embodiments of the present invention have been shown and described, it will be obvious to those skilled in the art that various changes and modifications may be made without departing from the spirit and scope of the present invention. For example, the dynamic random access memory device may form a part of an ultra large integration together with other function blocks.

What is claimed is:

1. A semiconductor memory device fabricated on a semiconductor chip comprising:

a memory cell array;

a plurality of first terminal means for communicating an address signal and a data signal through an external device;

an access means connected to said plurality of first terminal means, and responsive to said address signal for selecting at least one memory cell from said memory cell array in a memory access mode, thereby carrying out a read-out of a data represented by said data signal and a write-in of a data represented by said data signal on the selected memory cell;

a second terminal means selected from said plurality of first terminal means, and receiving information for determining a refresh cycle from the outside of said semiconductor chip in said refresh mode; and a refresh means including a refresh timer for periodically generating a timer signal, and carrying out a refreshing operation on said memory cell array on the basis of said timer signal supplied from said refresh timer in a refresh mode, said refresh means further including a means responsive to said information so as to cause said refresh timer to change an interval of said timer signal.

2. A semiconductor dynamic random access memory device having a memory access mode for a read-out of data and a write-in of data and a refresh mode for refreshing data, comprising:

a memory cell array having a plurality of addressable memory cells for storing said data, respectively;

an addressing system responsive to an external address signal for making said plurality of memory cells selectively accessible in said memory access mode, and responsive to a refresh address signal for selectively reading out said data from said plurality of memory cells in said refresh mode;

a sense amplifier unit coupled to said memory cell array for magnifying potential differences indicative of said data in both of said memory access mode and said refresh mode;

a plurality of first terminal means receiving said external address signal and a first data signal and outputting a second data signal for communicating with an external device;

a self-refreshing system including a second terminal means selected from said plurality of first terminal means for receiving a control data signal indicative of a time interval of said refresh cycle in said refresh mode, a refresh cycle regulating means coupled to said second terminal means for receiving said control data signal and producing a control data signal indicative of time intervals corresponding to said time interval represented by said control data signal, a timer means responsive to said control data signal for periodically producing a timing control signal at said time intervals in said refresh mode, and a refresh address generating means responsive to said timing control signal for periodically incrementing an address represented by said refresh address signal in said refresh mode.

3. The semiconductor dynamic random access memory device as set forth in claim 2, in which said timer means includes an oscillator for generating a periodic signal, a counter for incrementing a count value in response to said periodic signal and generating a multi-bit count signal indicative of said count value, and a divider having a plurality of input nodes respectively supplied with the bits of said multi-bit count signal, a logic gate having a plurality of input nodes and generating said timing control signal when a bit pattern at said input nodes thereof is matched with a reference pattern, and a transfer circuit responsive to said control data signal for selectively transferring said bits of said multi-bit count signal to said input nodes of said logic gate.

4. The semiconductor dynamic random access memory device as set forth in claim 3, in which said logic gate is a NAND gate, and said reference pattern is constituted by logic "1" level bits.

5. The semiconductor dynamic random access memory device as set forth in claim 2, in which said refresh cycle regulating means has a default section for maintaining a standard time interval of said refresh cycle, said refresh cycle regulating means producing said control data signal indicative of said standard time interval when said control data is not received in said refresh mode.

* * * * *